(12) United States Patent
Wang et al.

(10) Patent No.: US 11,668,761 B2
(45) Date of Patent: Jun. 6, 2023

(54) ADAPTIVE SHORT CIRCUIT DETECTION SYSTEM AND METHOD FOR AN INFORMATION HANDLING SYSTEM (IHS)

(71) Applicant: Dell Products, L.P., Round Rock, TX (US)

(72) Inventors: Lei Wang, Austin, TX (US); Wen-Hung Huang, Taipei (TW); Guangyong Zhu, Austin, TX (US); Jaehyeung Park, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 17/494,971

(22) Filed: Oct. 6, 2021

(65) Prior Publication Data
US 2023/0104077 A1 Apr. 6, 2023

(51) Int. Cl.
*G01R 31/52* (2020.01)

(52) U.S. Cl.
CPC .................... *G01R 31/52* (2020.01)

(58) Field of Classification Search
CPC ....... G01R 31/50; G01R 31/52; G01R 31/281
See application file for complete search history.

(56) References Cited

U.S. PATENT DOCUMENTS

| | | | | |
|---|---|---|---|---|
| 6,097,107 A * | 8/2000 | Ikeda | ................... | B60H 1/3225 361/22 |
| 9,742,220 B2 * | 8/2017 | Jeon | ........................ | H02J 9/061 |
| 10,373,283 B2 * | 8/2019 | Ragupathi | ............. | G06F 9/5083 |
| 2008/0301476 A1 * | 12/2008 | Itakura | ..................... | H02J 1/102 713/300 |
| 2012/0072739 A1 * | 3/2012 | Isaacson | .................... | H02J 1/10 307/64 |
| 2014/0068282 A1 * | 3/2014 | Jenne | .................... | G06F 1/3234 713/300 |
| 2015/0067378 A1 * | 3/2015 | Kobayashi | ............. | G01R 31/52 713/340 |
| 2016/0066912 A1 * | 3/2016 | Baber | .................... | H02H 3/087 307/64 |
| 2016/0343526 A1 * | 11/2016 | Schicke, II | .......... | H01H 47/002 |
| 2017/0245379 A1 * | 8/2017 | Kang | ..................... | G01R 31/52 |

(Continued)

OTHER PUBLICATIONS

"How you can detect your GPU have a Short circuit-testing graphic card" https://www.youtube.com/watch?v=nCsqJjTiP1s, 1 page, uploaded by Frog-Tech-Tips (Year: 2017).*

*Primary Examiner* — Patrick Assouad
*Assistant Examiner* — Demetrius R Pretlow
(74) *Attorney, Agent, or Firm* — Fogarty LLP

(57) ABSTRACT

Embodiments of systems and methods for detecting short circuits in a load are described. In an illustrative, non-limiting embodiment, a short circuit detection system includes a first circuit, a second circuit, and a controller. The first circuit has an output and an input coupled to a load and an auxiliary power source through a resistor, while the second circuit is configured to enable an output of the short circuit detection circuit for a specified period of time following application of auxiliary power at the auxiliary power source. The controller includes computer-executable instructions to monitor the output of the first circuit, and allow or disallow a main power source from powering the load based upon whether a short circuit condition exists.

17 Claims, 3 Drawing Sheets

(56) References Cited

U.S. PATENT DOCUMENTS

| | | | | |
|---|---|---|---|---|
| 2017/0350942 A1* | 12/2017 | Kinsella | ............... | G01R 31/52 |
| 2018/0254695 A1* | 9/2018 | Igarashi | ............... | H02M 3/156 |
| 2019/0384666 A1* | 12/2019 | Puthillathe | ............... | G06T 1/20 |
| 2020/0088778 A1* | 3/2020 | Zeng | ............... | G01R 31/007 |
| 2020/0093487 A1* | 3/2020 | Baber | ............... | A61B 90/92 |
| 2020/0341075 A1* | 10/2020 | Nakamura | ............... | G01R 31/2818 |

* cited by examiner

ADAPTIVE SHORT CIRCUIT DETECTION SYSTEM AND METHOD FOR AN INFORMATION HANDLING SYSTEM (IHS)

FIELD

The present disclosure relates generally to Information Handling Systems (IHSs), and more particularly, to a short circuit detection system and method for an IHS.

BACKGROUND

Power sources, such as voltage converters, power amplifiers, and the like exist in various electronic devices (e.g., personal computers, edge computers, tablet computers, smart phones, music players etc.), and each power source has a rated current. When the current flowing in the electronic devices and/or their associated power sources exceed their rated current, they often may burn out and not work. Therefore, it is necessary to provide overcurrent protection to protect the power sources and/or electronic devices against scenarios where the current becomes excessive.

The various electronic devices require a power source to supply power so that they can work. Overcurrent protection can be achieved by disconnecting the electronic module from its power source. However, cutting off the power supply of the electronic device may cause disturbance of its operation, which may affect the operation of other devices or electronic circuits associated with the electronic device.

It is important that electrical devices be protected from damage when electrical failures occur. For example, conventional fuses and electro-mechanical circuit breakers are commonly employed to disconnect equipment from an electrical supply upon detection of excessive current when a short circuit occurs. Nevertheless, these conventional protection devices are relatively slow in disconnecting the current flow to the apparatus being protected. As a consequence, sufficient excessive electrical current can flow into the electronic devices in a short period of time to cause damage.

SUMMARY

According to one embodiment, an Information Handling System (IHS) includes a first circuit, a second circuit, and a controller. The first circuit has an output and an input coupled to a load and an auxiliary power source through a resistor, while the second circuit is configured to enable an output of the short circuit detection circuit for a specified period of time following application of auxiliary power at the auxiliary power source. The controller includes computer-executable instructions to monitor the output of the first circuit, and allow or disallow a main power source from powering the load based upon whether a short circuit condition exists.

According to another embodiment, a short circuit detection method includes certain steps to be performed on an Information Handling System (IHS) when powered on. The steps include controlling the auxiliary power source to apply power to a load, monitoring the output of a short circuit detection circuit coupled between an auxiliary power source and the load, and when the output indicates that a short circuit condition exists, controlling the main power source to disallow application of electrical power to the load. Conversely, when the output indicates that a short circuit condition does not exist, controlling the main power source to allow application of electrical power to the load.

According to yet another embodiment, a short circuit detection system includes an Information Handling System (IHS) comprising a main power source, an auxiliary power source, a short circuit detection circuit, and a controller. The short circuit detection circuit is coupled between the auxiliary power source and the load. The controller includes computer-executable instructions to control the auxiliary power source to apply power to the load, monitor the output of the short circuit detection circuit, and allow or disallow a main power source from powering the load based upon whether a short circuit condition exists.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Figure 1:
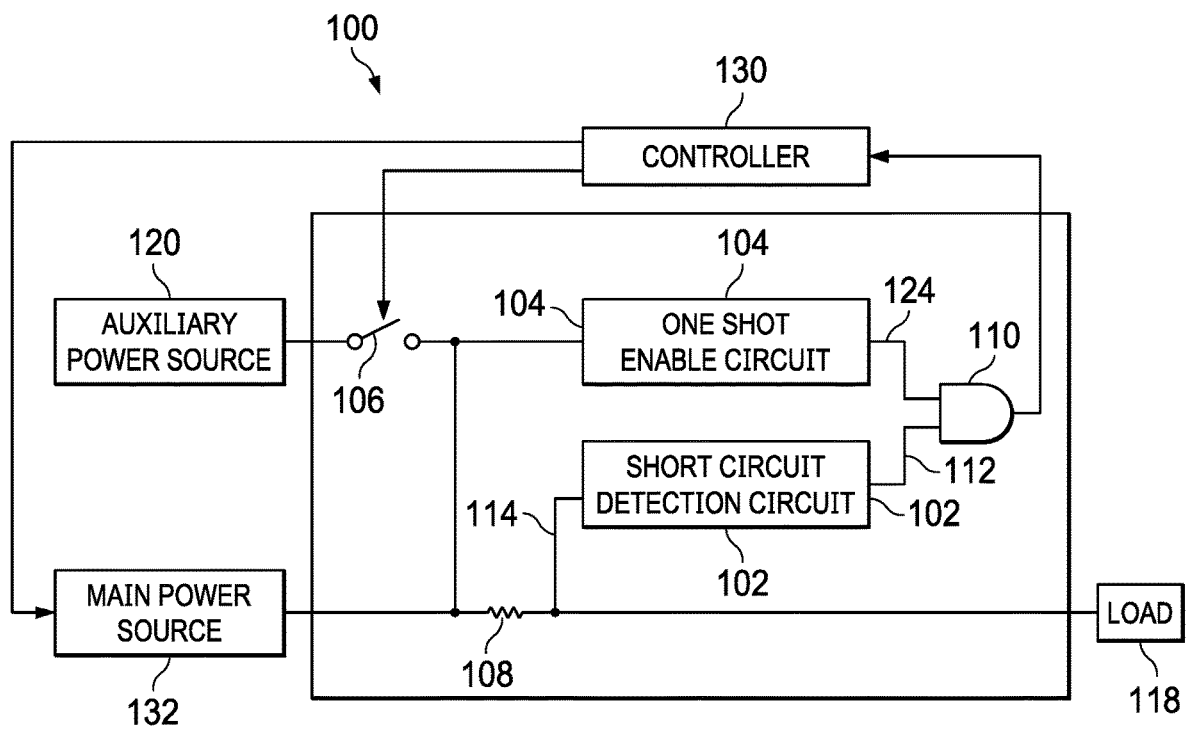
FIG. 1 illustrates an example short circuit detection system according to one embodiment of the present disclosure.

Embodiments of the present disclosure provide a short circuit detection system and method in which electrical devices, and in particular those having high current requirements, may be protected from short circuit faults. Whereas conventional electrical devices with high current requirements have heretofore been difficult to monitor due in large part, to corresponding large voltage gradients incurred in its power delivery circuitry, providing overcurrent protection for such devices has heretofore remained a challenging endeavor. Embodiments of the present disclosure provide a solution to this problem, among others, by implementing a technique whereby a low current auxiliary power source is used to test for a short circuit condition each time the electrical device is started, thus alleviating or reducing the need for managing the voltage gradients that often exist in such systems.

While embodiments of the present disclosure may be adapted for use with any suitable type of electrical device, certain embodiments may be particularly beneficial for IHSs, such as edge servers that may be configured with hardware components having high current requirements. For example, newer generation Graphics Processing Unit (GPU) cards can consume rather large amounts of electrical power. In fact, certain GPU cards can draw more than 500 Watts. Certain GPU sled designs configured with a motherboard and four GPU cards can draw more than 3.6 Kilo-Watts. Thus to achieve redundancy, four 2,400 Watt Power Supply Units (PSUs) may be needed. Because the GPU sled design utilizes a 12 volt rail, each PSU should be rated at 200 Amps, thus requiring an overcurrent protection point of approximately 1000 Amperes. Additionally, since the load current is so high, the distribution impedance should be designed to be low to maintain a sufficient level of efficiency.

For such a system, if the PSU's overcurrent protection is used to detect against a short circuit failure, there is a relatively good chance it may not be properly detected. Mathematically, if the system load is not high enough and the short circuit's impedance is not very low (e.g., usually varying, in the tens to hundreds milli-Ohm range), then the total current draw will still be lower than 1000 A, and as a result, it may not trigger the PSU's overcurrent protection circuit. The existing solution to this problem has been to separate the load to multiple zones (e.g., branches) and use a Hot Swap Circuit (HSC) solution with current sense shunts and Field Effect Transistors (FETs) on each branch to measure its current level. If any of the branches sees an overcurrent condition (e.g., approximately 130%) of its maximum rating, the FETs will be turned off to block a failure on its respective load branch. The cost of such a system, however, is unduly high, while occupying a large amounts of Printed Circuit Board (PCB) space. It may be important to note that given such a mode of operation, the system may automatically re-start one more time after the overcurrent condition is triggered so the high levels of current will flow through the failure location again. Because a user may not be aware of the true nature of the problem, they may attempt to restart the system manually, thus causing additional high levels of current to flow through the faulted condition, thus potentially causing further damage to the system.

Other conventional solutions usually detect load point voltage levels to determine whether a short circuit condition exists by assuming the distribution impedance is much higher than short circuit impedance. But in such high power/low distribution impedance systems (e.g., the GPU sled design described above), the distribution impedance is so low that, even a 20 milli-Ohm short could still maintain close to 12 volts rail at a load side power distribution network. Embodiments of the present disclosure provide a solution to this problem, among others, by implementing a short circuit detection system and method that determines whether a short circuit failure exists in such high power/low distribution impedance systems as will be described in detail herein below.

FIG. 1 illustrates an example short circuit detection system 100 according to one embodiment of the present disclosure. The short circuit detection system 100 includes a short circuit detection circuit 102, a one shot enable circuit 104, a switch 106, a resistor 108, and an AND gate 110. The short circuit detection circuit 102 includes an output 112 and an input 114 coupled to a load 118 and an auxiliary power source 120 through the resistor 108. The one shot enable circuit 104 is configured to enable the output 112 of the short circuit detection circuit 102 for a specified period of time following application of electrical power at the auxiliary power source 120 by gating its output 124 through the AND gate 110. The short circuit detection system 100 is controlled by a controller 130 that monitors the output 112 of the short circuit detection circuit 102 such that when the output 112 indicates that a short circuit condition exists in the load 118, the controller controls a main power source 132 to disallow application of electrical power to the load 118.

In general, when an electrical device embodying the system 100 is initially turned on, the controller 130 controls the auxiliary power source 120 to apply power to the load 118 via the switch 106. For the specified period of time determined by the one shot enable circuit 104, the controller 130 monitors the output 112 of the short circuit detection circuit 102, and when the output 112 indicates that a short circuit condition exists, it controls the main power source 132 to disallow application of electrical power to the load 118. Additionally or alternatively, the specified period of time may be provided, for example, an output port of the controller 130. That is, the controller 130 disallows the main power source 132 from applying electrical power to the load 118 when a short circuit condition exists during the time window specified by the one shot enable circuit 104.

The auxiliary power source 120 may be any type that provides sufficient power for generating a current through the resistor 108 which is in turn applied to the load 118. A nominal voltage for the auxiliary power source 120, and the resistance value of the resistor 108 is selected so that the current is limited when a short circuit condition does exist. In the case there is no short circuit fault, the point at the load 118 will eventually reach the full voltage of the auxiliary power source 120. In such a case, the system may disable all the loads connected to main power source.

In one embodiment, the auxiliary power source 120, main power source 132, and load 118 form a portion of an IHS, such as an edge server in which the load 118 is a high power device, such as a GPU card as described above. In another embodiment, the controller 130 may be a Baseboard Management Controller (BMC), such as an integrated Dell Remote Access Controller (iDRAC) from Dell Enterprises® that is embedded within a Dell PowerEdge™ server. The iDRAC provides functionality that helps information technology (IT) administrators deploy, update, monitor, and maintain servers remotely.

Figure 2:
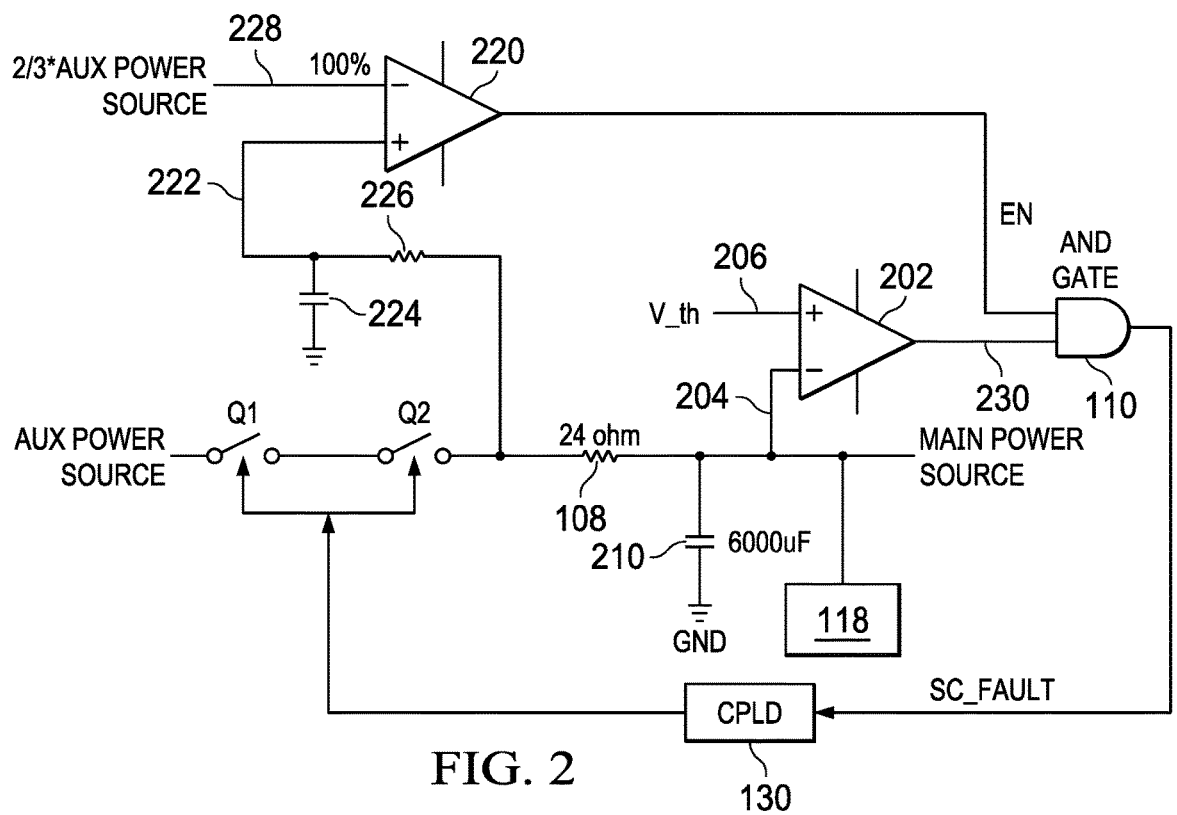
FIG. 2 illustrates a detailed view of several components that form the short circuit detection system of FIG. 1 according to one embodiment of the present disclosure.

FIG. 2 illustrates a detailed view of several components that form the short circuit detection system of FIG. 1 according to one embodiment of the present disclosure. As shown, the short circuit detection system 100 includes a first comparator 202 with an inverting input 204 coupled to the load 118, and a non-inverting input 206 to a source voltage (V_th), which in this particular example embodiment, is set at approximately 1.0 Volts. The short circuit detection system 100 also includes a capacitor 210 that forms a first RC circuit with the resistor 108. Together, the resistor 108, first comparator 202, and capacitor 210 form the short circuit detection circuit 102 as described above with reference to FIG. 1. The resistor 108 limits the current (e.g., less than 1 Ampere) provided to the load 118 while the load 118 is disabled. The capacitor 210 is shown having a value of approximately 6000 micro-Farads although it may have any suitable value based upon the application. If no short circuit condition in the load 118 exists, the node at the load 118 will be charged at the rate of the time constant of the first RC circuit.

The short circuit detection system 100 also includes a second comparator 220 with an inverting input 222 coupled to a capacitor 224 and a resistor 226 forming a second RC circuit. The second RC circuit and comparator 220 essentially forms a delay circuit. A non-inverting input 228 of the second comparator 220 is coupled to a voltage source, which in this particular example embodiment, is set at approximately 8.0 volts. In general, the second comparator 220, capacitor 224, and resistor 226 form the one shot enable circuit 104 as described above with reference to FIG. 1. The time constant of the first RC circuit and second RC circuit may be set to approximately the same value for generating a defined time delay approximately equal to the time needed to charge the load voltage to 8.0 Volts for example. The short circuit detection system 100 also includes a back-to-back switch Q1, Q2 (e.g., MOSFETs) that couple the auxiliary power source 120 to the resistor 108, thus forming the switch 106 as described above with reference to FIG. 1.

The output 230 of the first comparator 202 is enabled when the input 222 of the second comparator 220 is above 8.0 Volts. But if a short circuit failure (e.g., 0-1 Ohms) exists at the load 118, the voltage at the load 118 will be based on the voltage divider value of the short circuit and resistor 108 value. For example, if the resistor 108 is 24.0 Ohms and the short circuit value is 1.0 Ohm, then the input 204 of the first comparator 202 will be lower than 0.5 volts, thus causing the output of the first comparator 202 to be active (e.g., high), in turn causing the output of the AND gate 110 to go to high.

Figure 3:
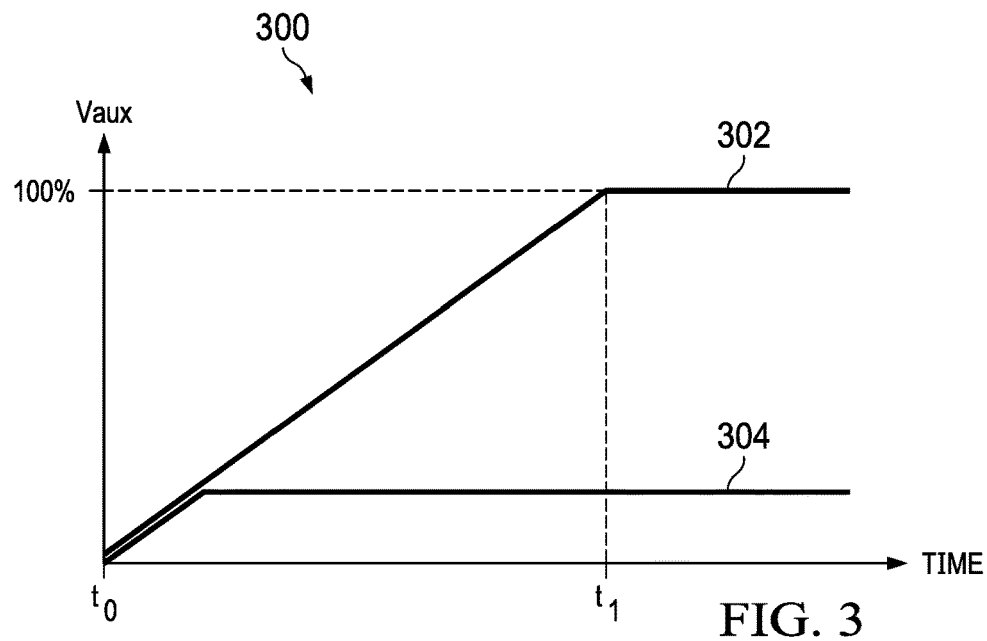
FIG. 3 illustrates an example graph showing voltage waveforms that may be exhibited under a non-short circuit condition and a short circuit condition according to one embodiment of the present disclosure.

FIG. 3 illustrates an example graph showing voltage waveforms that may be exhibited under a non-short circuit condition and a short circuit condition according to one embodiment of the present disclosure. In particular, waveform 302 is the voltage exhibited at the load 118 when the short circuit detection system 100 is initially started under a non-short circuit condition, while waveform 304 is the voltage exhibited at the load 118 when the short circuit detection system 100 is initially started under a short circuit condition. The horizontal axis represents a time originating from initial startup (e.g., to), and the vertical axis represents the voltage as measured at the load 118.

As shown in waveform 302, no short circuit condition exists, therefore the first RC circuit (e.g., resistor 108 and capacitor 210 combination) is allowed to freely ramp up to the voltage of the auxiliary power source 120. On the other hand, waveform 304 shows that, because a short circuit condition exists at the load 118, the resulting voltage may be:

$$V_{load} = (V_{aux} * R_{short})/(R_{short} + \text{Resistor 108});$$

where:
$V_{load}$ is the voltage at the load;
$V_{aux}$ is the voltage at the auxiliary power source; and
$R_{short}$ is the resulting impedance at the load.

Given this case, the source voltage V_th can be selected so that any conceivable short circuit condition may be detected using the short circuit detection system 100. For example, the source voltage V_th may be selected to be approximately 1.0 Volts so that the short circuit detection system 100 may detect short circuit conditions as high as approximately 2.0 Ohms.

Figure 4:
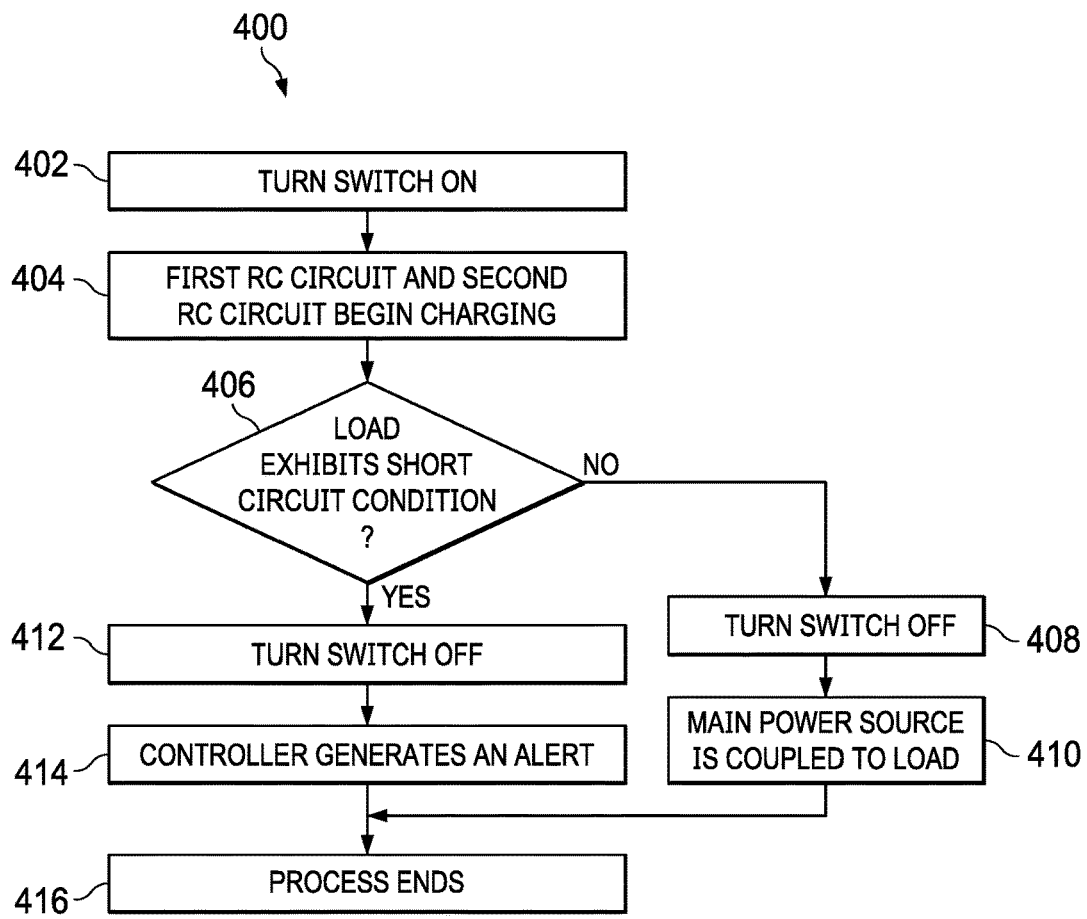
FIG. 4 illustrates an example method that may be performed by the short circuit detection system to check for short circuit conditions during startup according to one embodiment of the present disclosure.

FIG. 4 illustrates an example method 400 that may be performed by the short circuit detection system 100 to check for short circuit conditions during startup according to one embodiment of the present disclosure. The method 400 may be performed any time the load 118 is started via the main power source 132. For example, the method 400 may be performed at initial power on or due to a system re-start, such as when the short circuit detection system 100 is configured in an IHS and that IHS is re-booted.

At step 402, the switch 106 is turned on. For an example in which the short circuit detection system 100 is configured in an IHS, the controller 130 may turn the switch 106 on in response to instruction(s) received from the system BIOS of the IHS. At this point the main power source is disconnected from the load 118 and only the auxiliary power source 120 is providing power to the load 118 through resistor 108 while the load 118 is disabled.

At step 404, the voltages of the first RC circuit (resistor 108/capacitor 210) and the second RC circuit (resistor 226/capacitor 224) are ramping up. The second RC circuit serves the purpose of providing a single (e.g., monostable) time window in which the short circuit detection system 100 can detect a short circuit condition at the load 118. The first RC circuit, on the other hand, detects whether a short circuit condition exists during the specified time window set by the first RC circuit at step 406. If no short circuit condition exists, processing continues at step 408; otherwise, processing continues at step 412.

At step 408, the switch 106 is turned off. Turning the switch 106 off effectively removes the auxiliary power source 120 from the circuit so that it is no longer a factor in how the load 118 or main power source 132 operates. In one embodiment, the switch 106 is turned off under the control of the controller 130. Thereafter at step 410, the main power source 132 is electrically coupled to the load 118. At this point, no short circuit condition has been detected and the main power source 132 is providing electrical power to the load 118.

Nevertheless, if a short circuit condition is detected at step 406, processing continues at step 412 in which the switch 106 is turned off to remove power from the auxiliary power source 120 to the load 118. As described above, the switch 106 may be turned off under control of the controller 130. Thereafter at step 414, the controller 130 generates an alert to let the user know that a problem exists. The alert may be in any suitable form. For example, the alert may be an audible or visual indicator provided at or near the location of the load 118 and/or main power source 132. For another example in which the short circuit detection system 100 is configured in an IHS, the alert may be a message that is sent from the controller 130 to a systems management console that remotely manages the IHS. OpenManage Enterprise (OME) is one example of a system management console provided by Dell Enterprises®, which cost-effectively facilitates comprehensive lifecycle management for the computing devices of distributed computing environments from one console. Given this example, a user remotely managing the IHS may receive a popup window informing the user that a short circuit condition exists on that IHS shortly after initial startup of the IHS. That is, the systems management console may issue the popup window in response to receiving the message from the controller 130.

In one embodiment, the systems management console may be configured with logic to, once it receives the alert message from the IHS, it may disable any further attempts to re-start the IHS until that IHS has undergone a maintenance procedure. For example, the systems management console may, when it receives a request to re-start the IHS, generate another popup window requesting that the user confirm that maintenance has been performed on that IHS before it allows it to be re-started.

In some embodiments, the systems management console may include logic to report a short circuit condition based on PSU total power output information and system power budget obtained from the IHS during operation. During operation of the IHS, the systems management console continually receives telemetry data from the IHS. The telemetry data may include, for example, PSU total power output information indicating a cumulative amount of power generated by the PSU, and a system power budget indicating an expected amount of power required for the IHS based on its configuration. Because certain hardware components, such as the GPU cards described herein above, can draw significantly more power than other hardware components, a short circuit condition in those GPU cards may cause significant increase in the overall power used by the IHS. The systems management console may leverage this information to estimate that a short circuit condition exists in the voltage rail that powers the GPU card based on the relative values received for the PSU total power output information and system power budget telemetry data obtained from the IHS during its operation.

After processing either of steps 408 or 412, the process ends at step 416. The method 400 described herein above may be performed each time the electrical device in which the load is configured is started. Nevertheless, when use of the method 400 is no longer needed or desired, the method 400 ends.

Although FIG. 4 describes one example of a process that may be performed by the short circuit detection system 100 for checking for a short circuit condition on a low impedance load, the features of the disclosed process may be embodied in other specific forms without deviating from the spirit and scope of the present disclosure. For example, the method 400 may perform additional, fewer, or different operations than those operations as described in the present example. As another example, certain of the aforedescribed steps may be performed in a different sequence than what is described herein. Furthermore, certain steps may be performed in sequence, or they may be performed concurrently.

Figure 5:
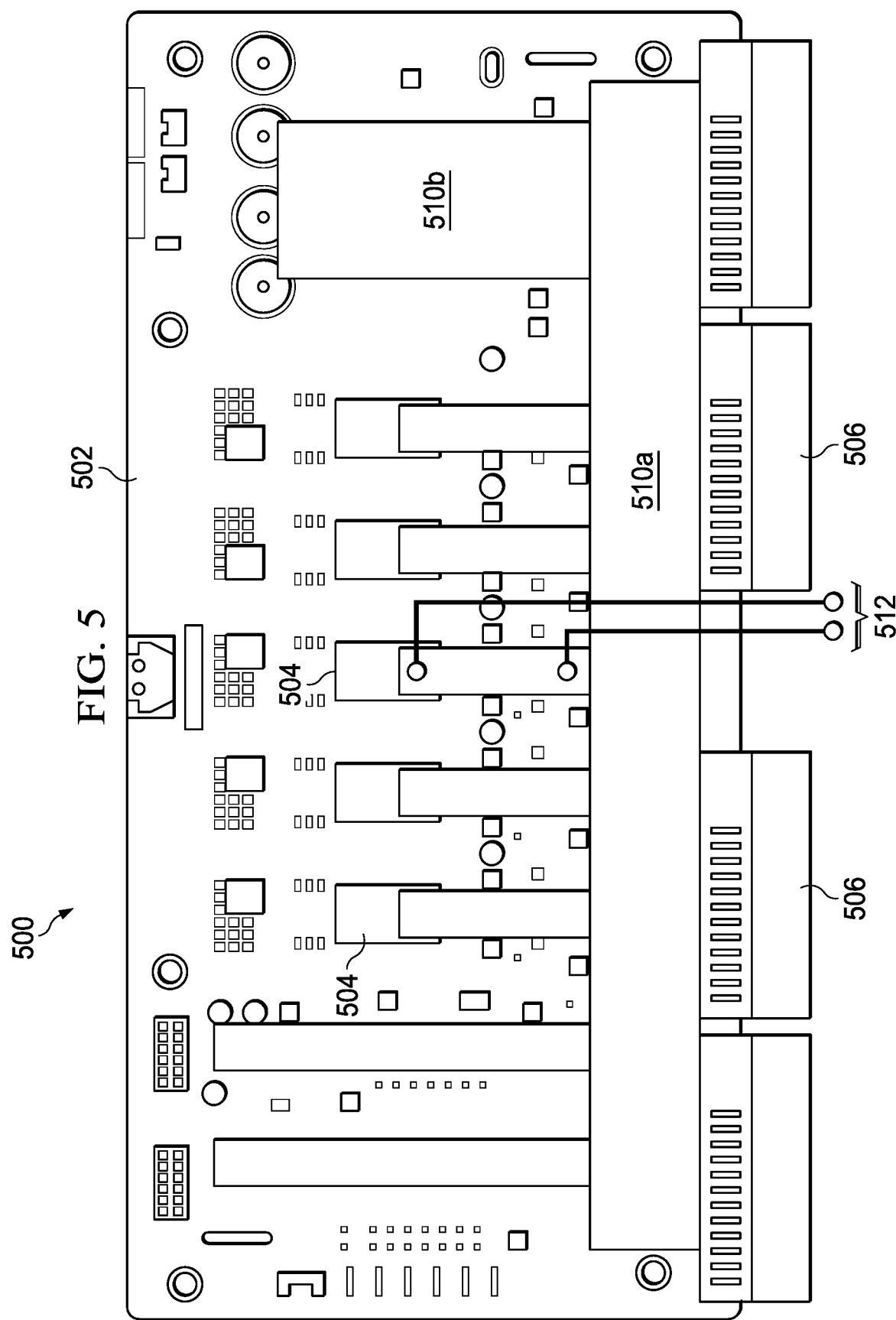
FIG. 5 illustrates an example Graphics Processing Unit (GPU) card that may be embodied as the load of the short circuit detection system according to one embodiment of the present disclosure.

FIG. 5 illustrates an example GPU card 500 that may be embodied as the load of the short circuit detection system 100 according to one embodiment of the present disclosure. In general, the GPU card 500 is configured to process graphics data, such as video images, still images, and the like, and may be adapted for use in an IHS, such as described herein above. The GPU card 500 includes a printed circuit board 502 configured with multiple graphics processing units 504 and one or more connectors 506 for mating with complementary connectors in the IHS.

As described previously, each of the graphics processing units 504 may draw relatively large amounts of electrical power. As such, the printed circuit board 502 may be configured with circuit traces 510a, 510b (collectively 510) having a relatively large size (e.g., area) to accommodate such current levels. The circuit traces 510 is generally referred to as a tree style power plane structure in which a root circuit trace portion 510a interconnects certain power terminals of the connectors 506 to multiple branch circuit trace portions 510b that in turn, electrically couple the power pins of the graphics processing units 504 to the root trace portion 510a.

Nevertheless, due to the relatively large level of current draw of each graphics processing unit 504, each branch circuit trace portion 510b may exhibit voltage gradients along its extent. In one embodiment, therefore, taps 512 may be electrically coupled to one or more of the branch circuit trace portions 510b for measuring a current consumed by its respective graphics processing unit 504. For example, a first tap 512 may be electrically coupled to the branch circuit trace portion 510b proximate the root circuit trace portion 510a, while a second tap 512 may be electrically coupled to the branch circuit trace portion 510b proximate the graphics processing unit 504. While the graphics processing unit 504 is consuming power, a voltage drop across the taps 512 may be used to measure the level of current being consumed by the graphics processing unit 504. Although only one branch circuit trace portion 510b is shown configured with taps 512, it should be appreciated that all or certain ones of the branch circuit trace portions 510b may be configured with taps 512 for measuring the current draw of their respective graphics processing unit 504.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterward be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A short circuit detection system comprising:
    a first circuit comprising an output and an input coupled to a load and an auxiliary power source through a resistor;
    a second circuit configured to enable the output for a specified period of time following application of auxiliary power at the auxiliary power source; and
    a controller comprising instructions stored in at least one memory and executed by at least one processor to:

monitor the output by measuring a current to the load via a pair of taps coupled to a trace of a circuit card, wherein the trace is configured to deliver electrical power to a power consuming device on the circuit card;

when the output indicates that a short circuit condition exists, disallow a main power source from powering the load; and when the output indicates that a short circuit condition does not exist, allow the main power source to power the load.

2. The short circuit detection system of claim 1, wherein:
the first circuit comprises a first resistor-capacitor (RC) circuit coupled to an input of a first comparator;
the second circuit comprises a second resistor-capacitor (RC) circuit coupled to a second input of a comparator; and
the time constant of the first RC circuit is similar to the time constant of the second RC circuit.

3. The short circuit detection system of claim 1, wherein the resistor is configured to limit current from the auxiliary power source to the load.

4. The short circuit detection system of claim 3, wherein the resistor has an impedance sufficient to limit the current below a specified value.

5. The short circuit detection system of claim 1, wherein the instructions are further configured to control the application of the auxiliary power from the auxiliary power source to the load.

6. The short circuit detection system of claim 1, wherein the instructions are further configured to perform the acts of monitoring the output, and controlling the main power source are performed each time the system is powered on.

7. The short circuit detection system of claim 1, wherein the load comprises a graphics processing unit (GPU) card.

8. The short circuit detection system of claim 7, wherein the GPU card is configured in an Information Handling System (IHS), and the controller comprises a Baseboard Management Controller (BMC) configured to control the operation of the IHS.

9. A short circuit detection method comprising:
when an Information Handling System (IHS) is powered on, controlling, using instructions stored in a memory and executed by a processor, an auxiliary power source to apply power to a load, wherein the Information Handling System (IHS) comprises a main power source, the auxiliary power source, and the load;

monitoring, using the instructions, the output of a short circuit detection circuit coupled between the auxiliary power source and the load by measuring a current to the load via a pair of taps coupled to a trace of a circuit card, wherein the trace delivers electrical power to a power consuming device on the circuit card;

when the output indicates that a short circuit condition exists, controlling, using the instructions, the main power source to disallow application of electrical power to the load; and when the output indicates that a short circuit condition does not exist, controlling, using the instructions, the main power source to allow application of electrical power to the load.

10. The short circuit detection method of claim 9, further comprising controlling the application of the auxiliary power from the auxiliary power source to the load.

11. The short circuit detection method of claim 9, further comprising performing the acts of monitoring the output, and controlling the main power source are performed each time the system is powered on.

12. A short circuit detection system comprising:
an Information Handling System (IHS) comprising a main power source, an auxiliary power source, and a load;
a short circuit detection circuit coupled between the auxiliary power source and the load; and
a controller comprising instructions stored in at least one memory and executed by at least one processor to, when the IHS is powered on:
control the auxiliary power source to apply power to the load;
monitor an output of the short circuit detection circuit by measuring a current to the load via a pair of taps coupled to a trace of a circuit card, wherein the trace is configured to deliver electrical power to a power consuming device on the circuit card;
when the output indicates that a short circuit condition exists, control the main power source to disallow application of electrical power to the load; and
when the output indicates that a short circuit condition does not exist, control the main power source to allow application of electrical power to the load.

13. The short circuit detection system of claim 12, wherein the instructions are further configured to control the application of the auxiliary power from the auxiliary power source to the load.

14. The short circuit detection system of claim 12, wherein the instructions are further configured to perform the acts of monitoring the output, and controlling the main power source are performed each time the system is powered on.

15. The short circuit detection system of claim 12, wherein the load comprises a graphics processing unit (GPU) card.

16. The short circuit detection system of claim 15, wherein the GPU card is configured in an Information Handling System (IHS), and the controller comprises a Baseboard Management Controller (BMC) configured to control the operation of the IHS.

17. The short circuit detection system of claim 12, wherein the short circuit detection circuit comprises a resistor to limit current from the auxiliary power source to the load, and wherein the resistor has an impedance that is sufficient to limit the current below a specified value.

* * * * *